United States Patent
Yun et al.

(10) Patent No.: US 8,289,780 B2
(45) Date of Patent: Oct. 16, 2012

(54) PAGE BUFFER, NONVOLATILE SEMICONDUCTOR MEMORY DEVICE HAVING THE SAME, AND PROGRAM AND DATA VERIFICATION METHOD

(75) Inventors: Sung-Won Yun, Suwon-si (KR); Oh-suk Kwon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 198 days.

(21) Appl. No.: 12/792,071

(22) Filed: Jun. 2, 2010

(65) Prior Publication Data

US 2010/0329029 A1  Dec. 30, 2010

(30) Foreign Application Priority Data

Jun. 29, 2009  (KR) .................. 10-2009-0058424

(51) Int. Cl.
*G11C 16/06* (2006.01)
(52) U.S. Cl. .......... 365/185.22; 365/185.12; 365/189.05
(58) Field of Classification Search ............. 365/185.22, 365/185.12, 189.05
See application file for complete search history.

(56) References Cited

U.S. PATENT DOCUMENTS

| | | | |
|---|---|---|---|
| 5,530,955 A * | 6/1996 | Kaneko | 711/104 |
| 5,920,507 A | 7/1999 | Takeuchi et al. | |
| 6,128,229 A | 10/2000 | Nobukata | |
| 7,227,790 B2 * | 6/2007 | Nam et al. | 365/189.07 |
| 7,535,775 B2 * | 5/2009 | Kang et al. | 365/189.05 |
| 7,639,529 B2 * | 12/2009 | Park et al. | 365/185.03 |
| 2008/0212368 A1 | 9/2008 | Kang | |

FOREIGN PATENT DOCUMENTS

| | | |
|---|---|---|
| JP | 09-198882 | 7/1997 |
| JP | 2000-276887 | 10/2000 |
| JP | 2008-181644 | 8/2008 |
| KR | 10-0253868 | 1/2000 |
| KR | 2008/212368 | 1/2000 |
| KR | 10-0543424 | 1/2006 |
| KR | 10-2008-0069478 | 7/2008 |

* cited by examiner

*Primary Examiner* — Pho M Luu

(74) *Attorney, Agent, or Firm* — Volentine & Whitt, PLLC

(57) ABSTRACT

A page buffer includes a sense latch, a data latch and a page buffer controller. The sense latch is connected to a bit line, and is configured to set stored data in response to a sense latch control signal, and to change the stored data in response to a signal applied to the bit line in a data verification operation. The data latch is configured to store multi-bit data to be programmed in a program operation, and to set stored data in response to a data latch control signal in the data verification operation. The page buffer controller is configured to control the bit line in accordance with the multi-bit data stored in the data latch in the program operation, and to output the sense latch control signal and the data latch control signal in accordance with the multi-bit data stored in the data latch in response to a control signal in the data verification operation.

20 Claims, 4 Drawing Sheets

PAGE BUFFER, NONVOLATILE SEMICONDUCTOR MEMORY DEVICE HAVING THE SAME, AND PROGRAM AND DATA VERIFICATION METHOD

CROSS-REFERENCE TO RELATED APPLICATION

A claim of priority under 35 U.S.C. §119 is made to Korean Patent Application No. 10-2009-58424, filed on Jun. 29, 2009, the contents of which are hereby incorporated herein by reference in its entirety.

BACKGROUND

Example embodiments relate to nonvolatile semiconductor memory devices, and more particularly, example embodiments relate to page buffers and nonvolatile semiconductor memory device including page buffers.

Nonvolatile semiconductor memory devices, such as flash memory device, are characterized by maintaining stored data in the absence of supplied power.

In the case of flash memory, the memory cells thereof are constituted by cell transistors each having a control gate, a floating gate, a source, and a drain. Each cell transistor is programmed or erased by selectively inducing Fowler-Nordheim (F-N) tunneling to set a threshold voltage of the cell transistor. In single-level cell (SLC) flash memory, each cell transistor is programmed (or erased) to one of two threshold voltages, thus defining 1 bit of stored data.

A relatively recent trend in flash memory technology is the development of multi-level cell (MLC) flash memory devices in which each cell transistor is utilized to store 2 or more bits of data. In MLC flash memory, each cell transistor is programmed (or erased) to more than two threshold voltages to thereby define 2 or more bits of stored data.

SUMMARY

Example embodiments are directed to a page buffer which includes a sense latch, a data latch and a page buffer controller. The sense latch is connected to a bit line, and is configured to set stored data in response to a sense latch control signal, and to change the stored data in response to a signal applied to the bit line in a data verification operation. The data latch is configured to store multi-bit data to be programmed in a program operation, and to set stored data in response to a data latch control signal in the data verification operation. The page buffer controller is configured to control the bit line in accordance with the multi-bit data stored in the data latch in the program operation, and to output the sense latch control signal and the data latch control signal in accordance with the multi-bit data stored in the data latch in response to a control signal in the data verification operation.

Other example embodiments are directed to a nonvolatile semiconductor memory device which includes a memory cell array, a page buffer and a controller. The memory cell array includes a nonvolatile memory cell string connected to a bit line, where the nonvolatile memory cell string includes a plurality of nonvolatile memory cells each programmable into a plurality of programmed states. The page buffer is connected to the bit line, and the controller is configured to output a control signal in accordance with a program operation and a data verification operation. Further, the page buffer includes a sense latch, a data latch, and a page buffer controller. The sense latch is connected to a bit line, and is configured to set stored data in response to a sense latch control signal, and to change the stored data in response to a signal applied to the bit line in a data verification operation. The data latch is configured to store multi-bit data to be programmed in a program operation, and to set stored data in response to a data latch control signal in the data verification operation. The page buffer controller is configured to control the bit line in accordance with the multi-bit data stored in the data latch in the program operation, and to output the sense latch control signal and the data latch control signal in accordance with the multi-bit data stored in the data latch in response to a control signal in the data verification operation.

The other example embodiments are directed to a program and data verification method of the nonvolatile semiconductor memory device, where the method includes setting a sense latch data according to whether a data latch data is data corresponding to a programmed state to be verified, setting the data latch data according to the sense latch data, performing a verification read operation according to the sense latch data, changing the sense latch data according to the result of the verification read operation, and restoring the data latch data according to the sense latch data.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF EXAMPLE EMBODIMENTS

Figure 1:
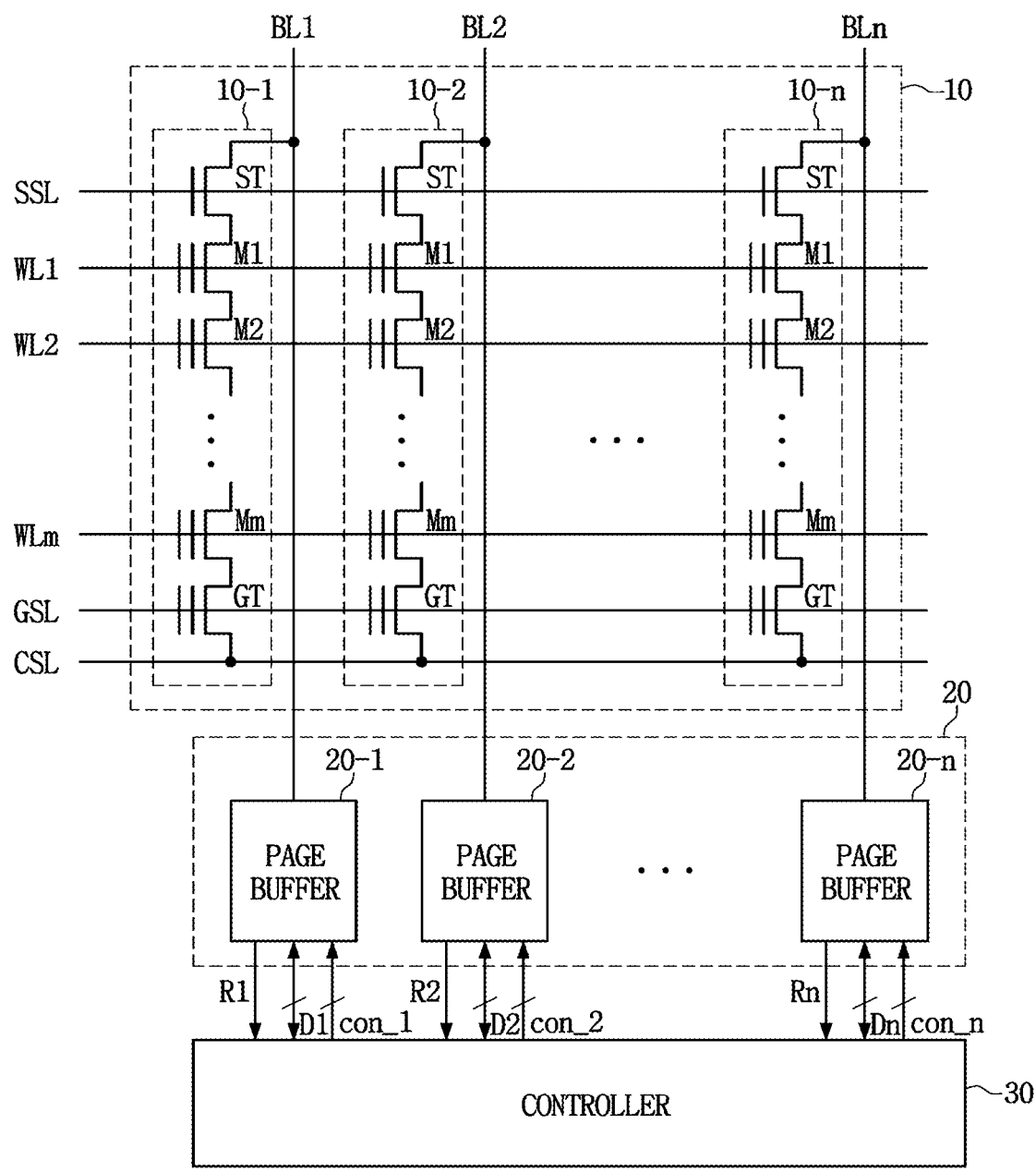
FIG. 1 illustrates the configuration of a nonvolatile semiconductor memory device according to example embodiments.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Hereinafter, a nonvolatile semiconductor memory device according to example embodiments will be described with reference to the accompanying drawings.

FIG. 1 illustrates the configuration of a nonvolatile semiconductor memory device according to example embodiments. The nonvolatile semiconductor memory device of this example includes a memory cell array 10, a page buffer unit 20, and a controller 30. The memory cell array 10 of this example includes a plurality of memory strings 10-1 to 10-$n$, each of which is connected to a corresponding bit line among a plurality of bit lines BL1 to BLn. The page buffer unit 20 of this example includes a plurality of page buffers 20-1 to 20-$n$, each of which is connected to a corresponding bit line among the plurality of bit lines BL1 to BLn. Further, each of the memory strings 10-1 to 10-$n$ of this example includes a string selection transistor ST connected to a corresponding bit line and having a gate connected to a string selection signal line SSL, a ground selection transistor GT connected to a common source line CSL and having a gate connected to a ground selection signal line GSL, and a plurality of memory cells M1 to Mm connected in series between the string selection line transistor ST and the ground selection transistor GT and having respective gates connected to a corresponding word line among a plurality of word lines WL1 to WLm.

The memory cell array 10 is subjected to program and erase/verification/read operations in response to signals applied to the bit lines BL1 to BLn, the string selection signal SSL, the word lines WL1 to WLm, the ground selection signal line GSL, and the common source line CSL. Although not shown, the string selection signal line SSL, the word lines WL1 to WLm, the ground selection signal line GSL, and the common source line CSL may be configured to be driven by the controller 30.

The page buffers 20-1 to 20-$n$ of the page buffer unit 20 are used in the execution of program and read operations. That is, the page buffers 20-1 to 20-$n$ execute program operations by driving the respective bit lines BL1 to BLn in response to control signals con_1 to con_n and data signals D1 to Dn from the controller 30, and the page buffers 20-1 to 20-$n$ execute read operations in response to the control signals con_1 to con_n. Further, as part of each the program operation, the page buffers 20-1 to 20-$n$ execute a data verification operation in response to the control signals con_1 to con_n, respectively. The data verificatio operation is executed to determine whether a memory cell has been sufficiently programmed during a programming cycle of the program operation. In the data verification operations of the example embodiments, the page buffers 20-1 to 20-$n$ output respective validation result signals R1 to Rn indicative of the data validation (verification) results.

The controller 30 outputs the control signals con_1 to con_n and the data signals D1 to Dn for performing the program, data verification, and read operations.

Figure 2:
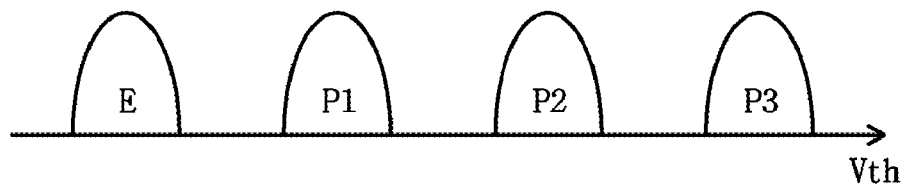
FIG. 2 is a diagram for explaining a program operation of a multi-level flash memory of a nonvolatile semiconductor memory device according to example embodiments.

FIG. 2 is a threshold voltage (Vth) distribution diagram for explaining a program operation of a multi-level flash memory of the nonvolatile semiconductor memory device. In FIG. 2, E represents a threshold voltage distribution of an erased state, and P1 to P3 represent respective threshold voltage distributions of first to third programmed states, respectively.

In an erase operation, when a predetermined word-line erase voltage is applied to a selected word line from among the word lines WL1 to WLm and a predetermined bit-line erase voltage is applied to the bit lines BL1 to BLn, threshold voltages Vth of memory cells connected to the selected word line become the erased state E of FIG. 2. The erased state may, for example, represent a two-bit data "11" as the stored data of a memory cell.

In a program operation, when a predetermined word-line program voltage is applied to a selected word line among the word lines WL1 to WLm and a predetermined bit-line program voltage is applied to selected bit lines BL1 to BLn depending on data to be stored in corresponding selected memory cells, electrons are injected into floating gates (not shown) of the selected memory cells and the threshold voltages Vth increases for the memory cells connected to the selected word line. The threshold voltages Vth of the memory cells increase as the program operation is repeated. In this manner, the threshold voltages Vth of the memory cells are selectively programmed one of the first to third programmed states P1 to P3. In the first to third states P1 to P3 may, for example, respectively represent two-bit data "01", "10", and "00" as the stored data of a memory cell.

In the example of FIG. 2, each nonvolatile memory cell is programmable in one of four states E and P1 to P3, and thus, each memory cell is utilized to store 2 bits of data. However, the example embodiments are not limited to 2-bit memory cells, and may be configured to have a larger number of programmed states than that of the example of FIG. 2.

Figure 3:
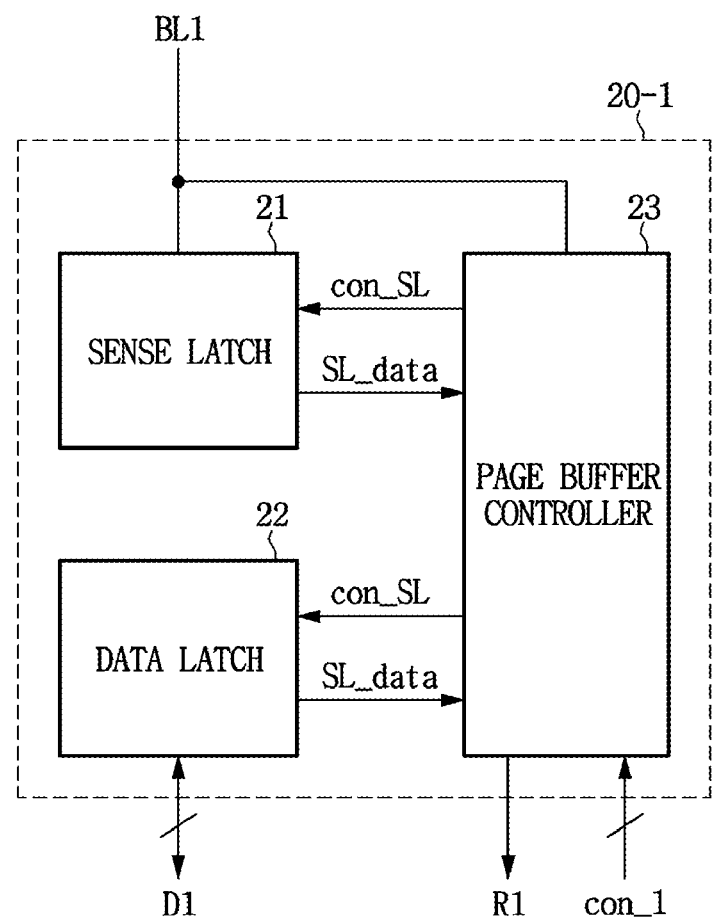
FIG. 3 is a block diagram of a page buffer according to example embodiments.

FIG. 3 illustrates an example of the page buffer 20-1 of the page buffer unit 20 of the nonvolatile semiconductor memory device shown in FIG. 1. The page buffer 20-1 of this example includes a sense latch 21, a data latch 22, and a page buffer controller 23. The remaining page buffers 20-2 to 20-n of FIG. 1 may, for example, be configured in the same manner as shown in FIG. 3.

The sense latch 21 is connected to the corresponding bit line BL1 among the plurality of bit lines BL1 to BLn. In a data verification, the sense latch 21 sets stored data in response to a sense latch control signal con_SL output from the page buffer controller 23, and then maintains or changes the stored data in response to a signal transmitted to the bit line BL1, and outputs the stored sense latch data SL_data to the page buffer controller 23.

In a program operation, the data latch 22 receives a multi-bit data signal D1 from the controller 30, stores the data signal D1 as data to be programmed, and outputs the stored data latch data DL_data to the page buffer controller 23. In a data verification operation, the data latch 22 sets data to be stored in response to a data latch control signal con_DL from the page buffer controller 23. After the data verification operation is completed, the data latch 22 restores the stored data to the data to be programmed, in response to a data latch control signal con_DL from the page buffer controller 23, and outputs the stored data to the controller 30.

The page buffer controller 23 performs the program and data verification operations in response to the control signal con_1 input from the controller 30. A more detailed description of the operation of the page buffer controller 23 will be presented later. Further, the page buffer controller 23 may be configured to control a corresponding bit line depending on the data stored in the data latch 22 in the program operation. For example, when the data stored in the data latch 22 in the program operation is data corresponding to the erased state (e.g., "11"), the page buffer controller 23 may apply a predetermined bit-line program inhibition voltage to the corresponding bit line such that the program operation is not performed on a memory cell connected to the corresponding bit line. When the data stored in the data latch 22 is data corresponding to the first to third programmed states (e.g., "01", "10", and "00"), the page buffer controller 23 may apply a predetermined bit-line program voltage to the corresponding bit line such that the program operation is performed on a memory cell connected to the corresponding bit line.

Figure 4:
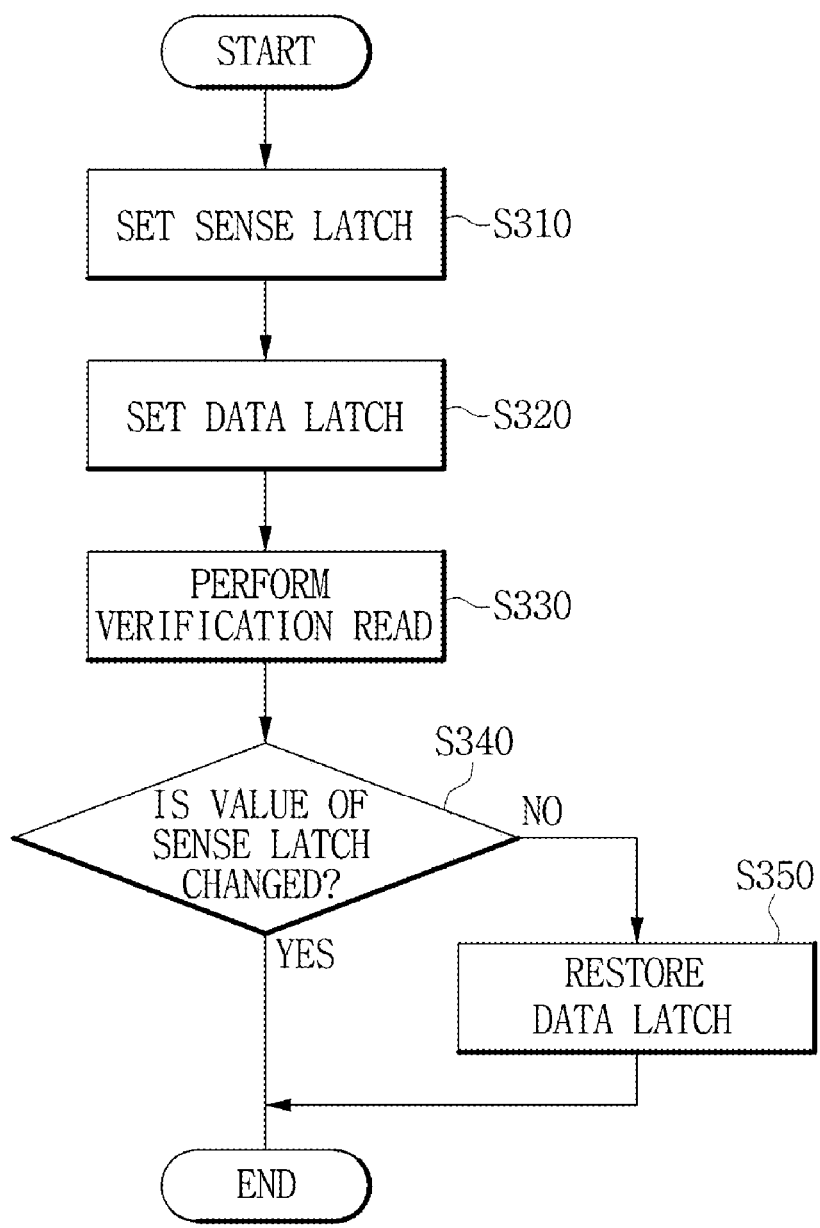
FIG. 4 is an operational flow chart for explaining a data verification operation of the page buffer of a nonvolatile semiconductor memory device according to example embodiments.

FIG. 4 is an operational flow chart for explaining the data verification operation of the page buffer controller 23 of the page buffer shown in FIG. 3.

However, prior to execution of the data verification operation of FIG. 4, a program operation is carried out. In the program operation, the controller 30 first outputs multi-bit data D1 to be programmed in a memory cell connected to a selected word line, and the data latch 22 of the page buffer 20-1 receives the data D1 to store the data D1 as data to be programmed. In the program operation, the data latch 22 provides the stored data latch data DL_data to the page buffer controller 23. In the program operation, the page buffer controller 23 controls a bit line depending on the data latch data DL_data in response to a control signal for the program operation from the controller 30. For example, when the data latch data DL_data is data corresponding to the erase data (e.g., "11"), the page buffer controller 23 may apply a predetermined bit-line program inhibition voltage to the bit line to prevent the memory cell connected to the selected word line from being programmed. When the data latch data DL_data is data corresponding to the first to third states P1 to P3 (e.g., "01", "10", and "00"), the page buffer controller 23 may apply a predetermined bit-line program voltage to the bit line to program the memory cell connected to the selected word line.

After the program operation is performed, the data verification operation is initiated. This is, for example, the controller 30 outputs a control signal con_1 for performing the data verification operation on a programmed state (e.g., the first programmed state P1) to be verified.

The data verification operation of the page buffer controller 23 of the page buffer 20-1 will now be described with reference to FIG. 4.

When the data stored in the data latch 22 is data (e.g., "01") corresponding to the programmed state to be verified (e.g., the first programmed state P1), the page buffer controller 23 outputs a sense latch control signal con_SL in response to the first control signal con_1 such that the data stored in the sense latch 21 is set to a first value (e.g., data "0"). When the data stored in the data latch 22 is not the data corresponding to the programmed state to be verified (e.g., the first programmed state P1), the page buffer controller 23 outputs a sense latch control signal con_SL such that the data stored in the sense latch 21 is set to a second value (e.g., data "1") (S310).

Next, when the data stored in the data latch 22 is the data corresponding to the programmed state to be verified, that is, when the data stored in the sense latch unit 21 is the first value (e.g., data "0"), the page buffer controller 23 outputs the data latch control signal con_DL such that the data stored in the data latch 22 is set to data (e.g., "11") corresponding to the erased state. On the other hand, when the data stored in the data latch 22 is not the data corresponding to the programmed state to be verified, that is, when the data stored in the sense latch 21 is the second value, the page buffer controller 23 outputs the data latch control signal con_DL such that the data latch 22 maintains the stored data (S320).

Next, the verification read operation is performed. That is, the controller 30 applies a predetermined voltage to the word line depending on the programmed state to be verified, and the page buffer determines a signal output to the bit line (S330).

The sense latch 21 may be configured to change the stored data from the first value to the second value when the signal output from the corresponding bit line is present, or maintain the stored data when a signal output from the corresponding bit line is absent. The page buffer controller 23 of the page buffer previously sets data stored in the sense latch 21 depending on the data to be stored in the memory cell connected to the corresponding bit line, in order to selectively perform the data verification operation. For example, when the data verification operation is performed on the first programmed state, the page buffer controller 23 of the page buffer, in which the data corresponding to the first programmed state (e.g., data "01") is stored in the data latch 22, sets the corresponding sense latch 21 to the first value, and the page buffer controllers 23 of the remaining page buffers set the corresponding sense latches 21 to the second value, to perform the data verification operation only on the first programmed state.

After the verification read operation, the page buffer controller 23 of the page buffer determines whether the value of the sense latch 21 has changed from the first value to the second value or not (S340).

When it is determined in operation S340 that the data in the sense latch 21 connected to the corresponding bit line has changed from the first value to the second value, the memory cell connected to the corresponding bit line is confirmed as the programmed state to be verified (e.g., the first programmed state), and the program operation is thus completed. When the data in the second latch 21 has changed from the first value to the second value, the page buffer controller 23 outputs a data latch control signal con_DL such that the data latch 22 maintains the data set in step S310, that is, the data corresponding to the erased state (e.g., "11").

When it is determined in operation S340 that the data in the sense latch 21 connected to the corresponding bit line has not changed, the memory cell connected to the corresponding bit line has not been confirmed to reach the programmed state to be verified (e.g., the first programmed state), which indicates that the program operation was not completed. When the data in the second latch 21 has not changed, the page buffer controller 23 outputs the data latch control signal such that the data stored in the corresponding data latch 22 is restored to data to be programmed (e.g., data corresponding to the first programmed state P1) (S350).

At this time, the page buffer controller 23 may be configured to output verification result signals R1 to Rn depending on the data stored in the sense latch 21. For example, when the data stored in the sense latch 21 is the second value, the page buffer controller 23 outputs a verification result signal indicating that the program operation was completed. When the data stored in the sense latch 21 is the first value, the page buffer controller 23 outputs a verification result signal indicating that the program operation was not completed.

The above-described process is repeatedly performed on the other programmed states (e.g., the second and third programmed states) to complete the data verification operation.

The other page buffers 20-2 to 20-$n$ perform the program and data verification operations in the same manner as the above-described operation of the page buffer 20-1.

Figure 5:
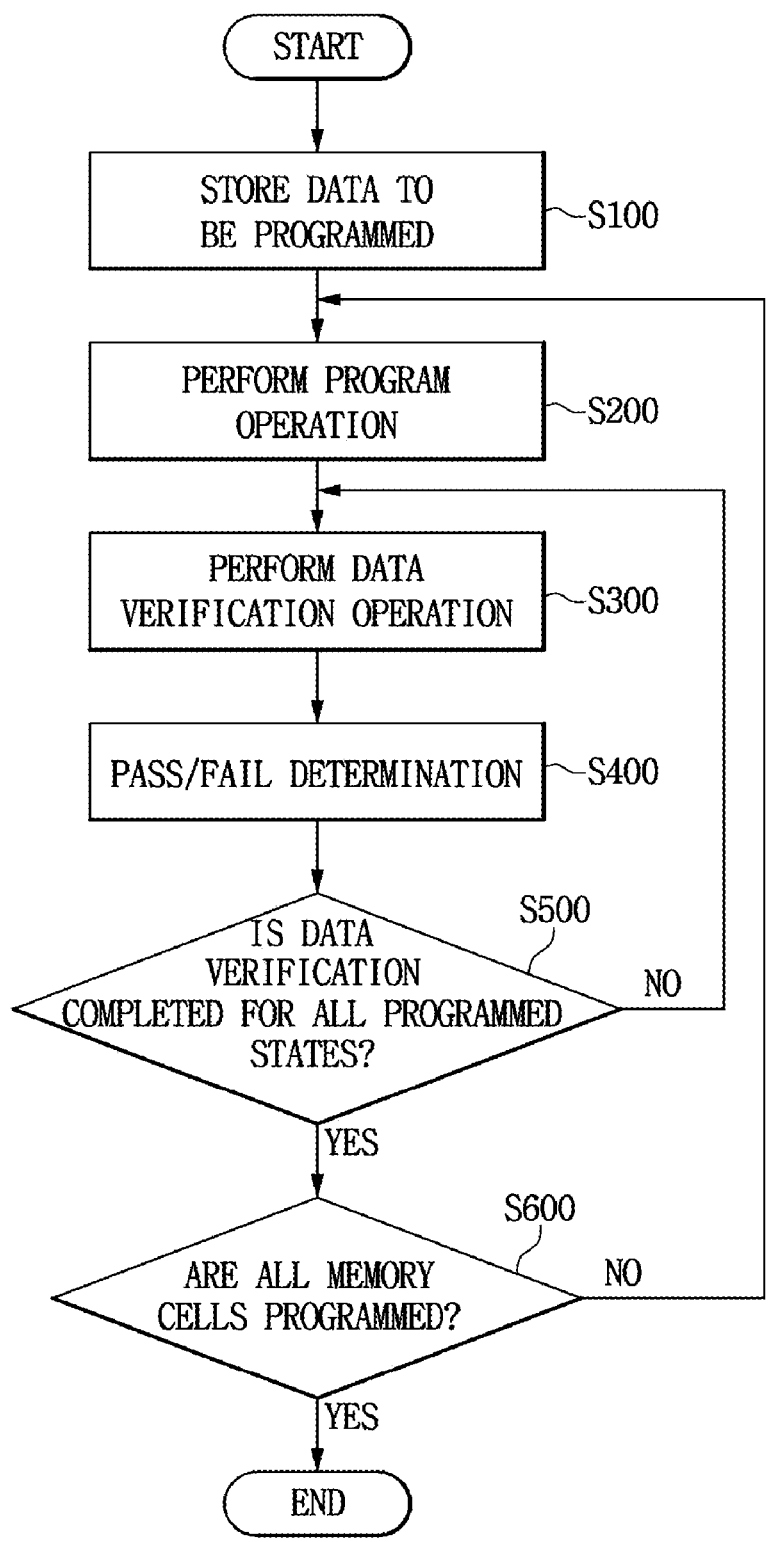
FIG. 5 is an operational flow chart for explaining a program operation and a data verification operation of a nonvolatile semiconductor memory device in according to example embodiments.

FIG. 5 is an operational flow chart for explaining program and data verification operations of the nonvolatile semiconductor memory device according to example embodiments.

Program and data verification operations of the nonvolatile semiconductor memory device according to example embodiments will now be described with reference to FIG. 5.

First, the controller 30 of the nonvolatile semiconductor memory device outputs multi-bit data to be programmed in respective memory cells connected to a selected word line and the data latches 22 of the page buffer corresponding to the memory cells store the data as data to be programmed (S100).

Next, the program operation is performed (S200). That is, the controller 30 of the nonvolatile semiconductor memory device applies a predetermined voltage for the program operation to the selected word line, the string selection signal line ST, the ground selection signal line GT, and the common source line, respectively, and the page buffers 20-1 to 20-$n$ of the page buffer unit 20 apply a predetermined voltage to the bit lines, depending on the data stored in the corresponding data latches 22, to perform the program operation. For example, when the data stored in the corresponding data latches 22 are data corresponding to the erased state (e.g., data "11"), the page buffers 20-1 to 20-$n$ of the page buffer unit 20 may apply a predetermined bit-line program inhibition voltage to the bit lines such that the program operation is not performed in the corresponding memory cells. When the data stored in the data latches 22 are data corresponding to the first to third programmed states (e.g., data "01", "10", and "00"), the page buffers 20-1 to 20-$n$ of the page buffer unit 20 may apply a predetermined bit-line program voltage to the bit lines depending on the stored data such that the program operation is performed in the corresponding memory cells.

Next, the data verification operation is performed (S300). The data verification operation may be performed in the same manner as described previously in connection with FIG. 4. That is, the data verification operation is individually performed on a specific programmed state to be verified.

It is then determined whether or not the program operation was completed for the programmed state to be verified (S400). That is, as described in connection with FIG. 4, the respective page buffer controllers 23 of the page buffers 20-1 to 20-$n$ of the page buffer unit 20 may be configured to output verification result signals R1 to Rn depending on the data stored in the sense latches 21, after performing the data verification operation. In this case, the controller 30 may receive the data verification result signals R1 to Rn output from the respective page buffers 20-1 to 20-$n$ to determine whether or not the program operation was completed for the specific programmed state.

Next, the controller 30 determines whether the data verification operation was performed on all the programmed states (S500).

When it is determined in operation 500 that the data verification operation was not performed on all the programmed states, the data verification operation is performed on a programmed state which is not verified.

For example, the controller 30 outputs control signals con_1 to con_n for performing the data verification operation on the first programmed state, and the respective page buffer controllers 23 of the page buffers 20-1 to 20-$n$ perform the data verification operation in response to the control signals (S300). After performing the data verification operation on the first programmed state, the controller 30 determines whether or not the memory cells which are to enter the first programmed state enter the first programmed state (S400). Next, the controller 30 determines whether or not the data verification operation was performed on all the programmed states (S500), and repeats operations S300 and S400 for the second and third programmed states, respectively. In this way, the data verification operation can be performed on all the programmed states.

When it is determined in operation S500 that the data verification operation was performed on all the programmed states, the controller 30 determines whether the program operation was completed for all the programmed states (S600). When the program operation is completed for all the programmed states depending on the data verification operation result, the data stored in the data latch 22 becomes data corresponding to the erased state E (for example, data "11"). Therefore, when all the data stored in the respective data latches 22 of the page buffers 20-1 to 20-n are data corresponding to the erased state E (e.g., data "11"), the controller 30 can determine that the program operation was completed for all the programmed states.

When it is determined in operation S600 that the program operation was not completed, operations S200 and S300 are repeated. That is, the program operation and the data verification operation are repeated. In this case, if it is determined in step S400 that the program operation was completed for a specific programmed state (e.g., the first programmed state P1), the data verification operation (that is, operations S300 and S400) may not be performed on the specific programmed state (e.g., the first programmed state (P1)).

According to example embodiments, a nonvolatile semiconductor memory device can selectively verify a specific programmed state in the data verification operation.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A page buffer comprising:
a sense latch connected to a bit line, and configured to set stored data in response to a sense latch control signal, and to change the stored data in response to a signal applied to the bit line in a data verification operation;
a data latch configured to store multi-bit data to be programmed in a program operation, and to set stored data in response to a data latch control signal in the data verification operation; and
a page buffer controller configured to control the bit line in accordance with the multi-bit data stored in the data latch in the program operation, and to output the sense latch control signal and the data latch control signal in accordance with the multi-bit data stored in the data latch in response to a control signal in the data verification operation.

2. The page buffer according to claim 1, wherein the data verification operation includes a read operation of the bit line, and wherein the page buffer controller is further configured to detect whether the data in the sense latch has changed as result of the read operation.

3. The page buffer according to claim 2, wherein the page buffer controller outputs the data latch control signal to restore the data stored in the data latch to the multi-bit data to be programmed when the data in the sense latch has not changed as a result of the read operation.

4. The page buffer according to claim 1, wherein the sense latch changes the stored data from a first value to a second value or maintains the stored data in response to a signal applied to the bit line in the data verification operation, and
the page buffer controller outputs the sense latch control signal such that when the multi-bit data stored in the data latch to be programmed is data corresponding to a programmed state to be verified in the data verification operation, the data in the sense latch is set to the first value, and when the multi-bit data stored in the data latch to be programmed is not the data corresponding to the programmed state to be verified, the data in the sense latch is set to the second value, and performs the data verification operation when the data in the sense latch is the first value.

5. The page buffer according to claim 4, wherein when the multi-bit data stored in the data latch to be programmed is data corresponding to the programmed state to be verified in the data verification operation, the page buffer controller outputs the data latch control signal such that the data in the data latch is set to data corresponding to an erased state, and when the data in the sense latch maintains the first value after the data verification operation, the page buffer controller outputs the data latch control signal such that the data in the data latch is restored to data corresponding to the programmed state to be verified.

6. A nonvolatile semiconductor memory device comprising:
a memory cell array including a nonvolatile memory cell string connected to a bit line, the nonvolatile memory cell string including a plurality of nonvolatile memory cells each programmable into a plurality of programmed states;
a page buffer connected to the bit line; and
a controller configured to output a control signal in accordance with a program operation and a data verification operation,
wherein the page buffer includes:
a sense latch connected to a bit line, and configured to set stored data in response to a sense latch control signal, and to change the stored data in response to a signal applied to the bit line in a data verification operation;
a data latch configured to store multi-bit data to be programmed in a program operation, and to set stored data in response to a data latch control signal in the data verification operation; and
a page buffer controller configured to control the bit line in accordance with the multi-bit data stored in the data latch in the program operation, and to output the sense latch control signal and the data latch control signal in accordance with the multi-bit data stored in the data latch in response to a control signal in the data verification operation.

7. The nonvolatile semiconductor memory device according to claim 6, wherein the data verification operation includes a read operation of the bit line, and wherein the page buffer controller is further configured to detect whether the data in the sense latch has changed as result of the read operation.

8. The nonvolatile semiconductor memory device according to claim 6, wherein the sense latch changes the stored data from a first value to a second value or maintains the stored data in response to a signal applied to the bit line in the data verification operation, and the page buffer controller outputs the sense latch control signal such that when the multi-bit data stored in the data latch to be programmed is data corresponding to a programmed state to be verified in the data verification operation, the data in the sense latch is set to the first value, and when the multi-bit data stored in the data latch to be programmed is not the data corresponding to the programmed state to be verified, the data in the sense latch is set to the second value, and performs the data verification operation when the data in the sense latch is the first value.

9. The nonvolatile semiconductor memory device according to claim 8, wherein when the multi-bit data stored in the data latch to be programmed is data corresponding to the programmed state to be verified in the data verification operation, the page buffer controller outputs the data latch control signal such that the data in the data latch is set to data corresponding to an erased state, and when the data in the sense latch maintains the first value after the data verification operation, the page buffer controller outputs the data latch control signal such that the data in the data latch is restored to data corresponding to the programmed state to be verified.

10. The nonvolatile semiconductor memory device according to claim 8, wherein the controller outputs the control signal for the program operation to perform the program operation, outputs the control signal for the data verification operation to perform the data verification operation on the plurality of programmed states, respectively, after the program operation, and repeats the program operation and the data verification operation when it is determined as the result of the data verification operation that the program operation is not completed on all the programmed states.

11. The nonvolatile semiconductor memory device according to claim 10, wherein the page buffer controller performs the data verification operation to output a verification result signal indicative of whether the data stored in the sense latch has changed, and the controller receives the verification result signal in the data verification operation to determine whether or not the program operation is completed for each of the programmed states, and does not perform the data verification operation on the programmed state in which the program operation is completed.

12. The nonvolatile semiconductor memory device of claim 6, wherein the nonvolatile memory cells include flash memory cell transistors, and wherein each cell transistor is programmed or erased by selectively inducing Fowler-Nordheim (F-N) tunneling to set a threshold voltage of the cell transistor.

13. A program and data verification method of a nonvolatile semiconductor memory comprising:

setting a sense latch data according to whether a data latch data is data corresponding to a programmed state to be verified or not;

setting the data latch data according to the sense latch data;

performing a verification read operation according to the sense latch data;

changing the sense latch data according to the result of the verification read operation; and restoring the data latch data according to the sense latch data.

14. The program and data verification method of claim 13, wherein the setting the sense latch data set the sense latch data to a first value when the data latch data is the data corresponding to the programmed state to be verified, and set the sense latch data to a second value when the data latch data is not the data corresponding to the programmed state to be verified.

15. The program and data verification method of claim 14, wherein the setting the data latch data set the data latch data to data corresponding to the erased state when the sense latch data is the first value, and maintains the data latch data when the sense latch data is the second value.

16. The program and data verification method of claim 15, wherein the performing a verification read operation applies a voltage depending on the programmed state to be verified to the word line.

17. The program and data verification method of claim 16, wherein the changing the sense latch data changes the sense latch data from the first value to the second value when a signal output from a bit line is present, and maintains the sense latch data when the signal output from the bit line is absent.

18. The program and data verification method of claim 17, wherein the restoring the data latch data maintains the data latch data when the sense latch data is the second value, and restores the data latch data to the data corresponding to the programmed state.

19. The program and data verification method of claim 13, further comprising:

outputting a verification result signals according to the sense latch data.

20. The program and data verification method of claim 13, further comprising:

storing data to be programmed as the data latch data; and performing a programming operation according to the data latch data.

* * * * *